United States Patent
Nelson et al.

(10) Patent No.: US 10,250,201 B2
(45) Date of Patent: Apr. 2, 2019

(54) SYSTEMS AND METHODS FOR THERMAL MANAGEMENT FOR TELECOMMUNICATIONS ENCLOSURES USING HEAT PIPES

(71) Applicant: CommScope Technologies LLC, Hickory, NC (US)

(72) Inventors: Michael J. Nelson, Prior Lake, MN (US); Kevin Thompson, Chaska, MN (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 15/287,410

(22) Filed: Oct. 6, 2016

(65) Prior Publication Data

US 2017/0026003 A1 Jan. 26, 2017

Related U.S. Application Data

(63) Continuation of application No. 13/914,738, filed on Jul. 15, 2013, now Pat. No. 9,474,187, which is a
(Continued)

(51) Int. Cl.
*H05K 7/20* (2006.01)
*H03F 1/30* (2006.01)
(Continued)

(52) U.S. Cl.
CPC ............. *H03F 1/30* (2013.01); *H03F 3/19* (2013.01); *H03F 3/21* (2013.01); *H05K 7/2039* (2013.01);
(Continued)

(58) Field of Classification Search
None
See application file for complete search history.

(56) References Cited

U.S. PATENT DOCUMENTS 6,304,441 B1 10/2001 Han
6,424,528 B1 7/2002 Chao
(Continued)

OTHER PUBLICATIONS

U.S. Patent and Trademark Office, "Notice of Allowance and Fees Due", "U.S. Appl. No. 13/026,484", dated Mar. 12, 2013, pp. 1-13.
(Continued)

*Primary Examiner* — Courtney Smith
(74) *Attorney, Agent, or Firm* — Fogg & Powers LLC

(57) ABSTRACT

Systems and methods for thermal management for telecommunications enclosures are provided. In one embodiment, a method for thermal management for modular radio frequency (RF) electronics housed within an electronics enclosure comprises: distributing heat generated from an RF electronics component installed on a first thermal region of an electronics module base plate across the first thermal region using at least one primary heat pipe that laterally traverses the first thermal region; distributing heat generated from the RF electronics component to a second thermal region using at least one secondary heat pipe not parallel with the at least one primary heat pipe; conductively transferring heat across a thermal interface between the electronics module back-plate and a backplane of an electronics enclosure that houses the electronics module, wherein the backplane comprises a plurality heat sink fins aligned with the at least one primary heat pipe and the at least one secondary heat pipe.

14 Claims, 4 Drawing Sheets

Figure 1:
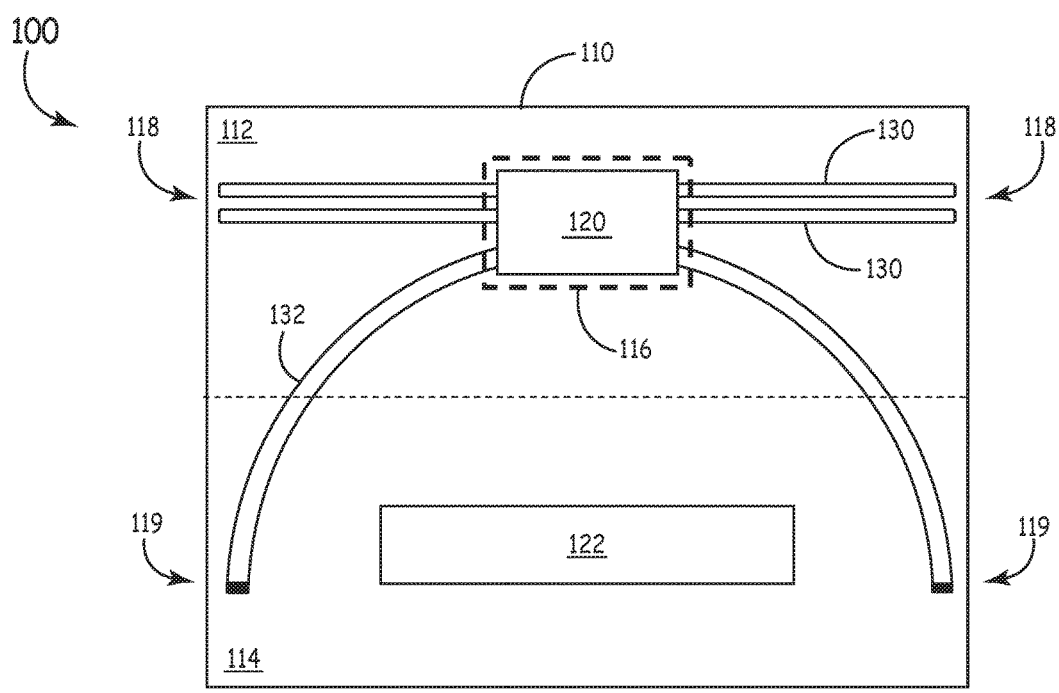

Related U.S. Application Data continuation of application No. 13/026,484, filed on Feb. 14, 2011, now Pat. No. 8,488,312.

(51) Int. Cl.
*H03F 3/19* (2006.01)
*H03F 3/21* (2006.01)
*H04W 88/02* (2009.01)

(52) U.S. Cl.
CPC ... *H05K 7/20681* (2013.01); *H03F 2200/447* (2013.01); *H03F 2200/451* (2013.01); *H04W 88/02* (2013.01)

(56) References Cited

U.S. PATENT DOCUMENTS

| | | | |
|---|---|---|---|
| 6,912,785 B2 | 7/2005 | Mitchell | |
| 6,966,361 B2* | 11/2005 | Connors | F28D 15/0233 165/104.33 |
| 7,028,758 B2* | 4/2006 | Sheng | F28F 1/32 165/104.21 |
| 7,130,193 B2 | 10/2006 | Hirafuji et al. | |
| 7,143,819 B2 | 12/2006 | Malone et al. | |
| 7,277,286 B2 | 10/2007 | Lee | |
| 7,342,788 B2 | 3/2008 | Nikfar | |
| 7,724,521 B2 | 5/2010 | Nelson et al. | |
| 7,864,534 B2 | 1/2011 | Wayman et al. | |
| 8,031,470 B2 | 10/2011 | Nelson et al. | |
| 8,270,170 B2 | 9/2012 | Hughes et al. | |
| 8,488,312 B2 | 7/2013 | Nelson et al. | |
| 2002/0131237 A1 | 9/2002 | Snyder et al. | |
| 2004/0222517 A1 | 11/2004 | Robertson et al. | |
| 2005/0201061 A1* | 9/2005 | Nikfar | F28D 15/0233 361/700 |
| 2006/0164808 A1 | 7/2006 | Stefanoski | |
| 2006/0196643 A1 | 9/2006 | Hata et al. | |
| 2007/0263355 A1 | 11/2007 | Yu et al. | |
| 2008/0043425 A1 | 2/2008 | Hebert et al. | |
| 2009/0279251 A1 | 11/2009 | Liu et al. | |
| 2009/0309467 A1 | 12/2009 | Nelson et al. | |
| 2009/0310309 A1 | 12/2009 | Nelson et al. | |
| 2009/0310312 A1 | 12/2009 | Wayman et al. | |
| 2009/0311969 A1 | 12/2009 | Wayman et al. | |
| 2009/0311974 A1 | 12/2009 | Nelson et al. | |
| 2010/0208430 A1* | 8/2010 | Huang | H05K 7/20336 361/709 |
| 2012/0206881 A1 | 8/2012 | Nelson et al. | |
| 2013/0301223 A1* | 11/2013 | Nelson | H05K 7/20681 361/716 |
| 2014/0160679 A1 | 6/2014 | Kelty | |
| 2015/0043467 A1* | 2/2015 | Kondo | H04L 27/0006 370/329 |
| 2015/0092348 A1* | 4/2015 | Newhouse | H05K 7/20336 361/694 |

OTHER PUBLICATIONS

U.S. Patent Office, "Advisory Action", "from U.S. Appl. No. 13/941,738", dated Jan. 15, 2016, pp. 1-4, Published in: US.

U.S. Patent Office, "Final Office Action", "from U.S. Appl. No. 13/941,738", dated Oct. 14, 2015, pp. 1-8, Published in: US.

U.S. Patent Office, "Notice of Allowance", "from U.S. Appl. No. 13/941,738", dated Jun. 21, 2016, pp. 1-5, Published in: US.

U.S. Patent Office, "Office Action", "from U.S. Appl. No. 13/941,738", dated Apr. 16, 2015, pp. 1-12, Published in: US.

U.S. Patent Office, "Office Action", "from U.S. Appl. No. 13/941,738", dated Feb. 29, 2016, pp. 1-8, Published in: US.

Loh et al., "Comparative Study of Heat Pipes Performances in Different Orientations", "21st IEEE Semiconductor-Thermal Measurement and Management Symposium", Mar. 15-17, 2005, pp. 191-195, Publisher: IEEE.

Thayer, John, "Analysis of a Heat Pipe Assisted Heat Sink", "http://www.thermacore.com/documents/HeatpipeAssistedAnalysis.pdf accessed Feb. 7, 2011", Dec. 1, 2000, pp. 1-6, Publisher: Thermacore.

\* cited by examiner

SYSTEMS AND METHODS FOR THERMAL MANAGEMENT FOR TELECOMMUNICATIONS ENCLOSURES USING HEAT PIPES

CROSS-REFERENCE TO RELATED APPLICATIONS

The present application is a continuation application of U.S. patent application Ser. No. 13/941,738 (hereafter the '738 Application) entitled "SYSTEMS AND METHODS FOR THERMAL MANAGEMENT FOR TELECOMMUNICATIONS ENCLOSURES USING HEAT PIPES" filed on Jul. 15, 2013 (currently pending), which is a continuation application of U.S. patent application Ser. No. 13/026,484 (hereafter the '484 Application) entitled "SYSTEMS AND METHODS FOR THERMAL MANAGEMENT FOR TELECOMMUNICATIONS ENCLOSURES USING HEAT PIPES" filed on Feb. 14, 2011 (now issued as U.S. Pat. No. 8,488,312), both of which are is incorporated herein by reference in their entirety.

BACKGROUND

Significant efforts are being made to increase thermal efficiency of radio telecommunications equipment and reduce the amount of heat generated within the enclosures housing such equipment. However, dissipating heat generated by radio power amplifiers within those enclosure remains a problem for the wireless telecommunications industry for at least two reasons. First, service providers are demanding more and more compact equipment enclosures while at the same time expecting greater functionality and capacity from each enclosure. Thus while various innovations improve the thermal efficiency of individual power amplifiers, the number of power amplifiers being housed in ever shrinking enclosures is increasing. Second, in order to provide more compact and less expensive equipment, the use of digital processing circuitry is on the rise. Such digital processing circuitry is sensitive to heat accumulation and will fail if operating temperatures within the equipment enclosure rise above their rated operating temperatures.

For the reasons stated above and for other reasons stated below which will become apparent to those skilled in the art upon reading and understanding the specification, there is a need in the art for improved systems and methods for thermal management for telecommunications enclosures.

SUMMARY

The Embodiments of the present invention provide methods and systems for thermal management for telecommunications enclosures and will be understood by reading and studying the following specification.

Systems and methods for thermal management for telecommunications enclosures are provided. In one embodiment, a method for thermal management for modular radio frequency (RF) electronics housed within an electronics enclosure comprises: distributing heat generated from an RF electronics component installed on a first thermal region of an electronics module base plate across the first thermal region using at least one primary heat pipe that laterally traverses the first thermal region; distributing heat generated from the RF electronics component to a second thermal region using at least one secondary heat pipe not parallel with the at least one primary heat pipe; conductively transferring heat across a thermal interface between the electronics module back-plate and a backplane of an electronics enclosure that houses the electronics module, wherein the backplane comprises a plurality heat sink fins aligned with the at least one primary heat pipe and the at least one secondary heat pipe.

DRAWINGS

Figure 2A:
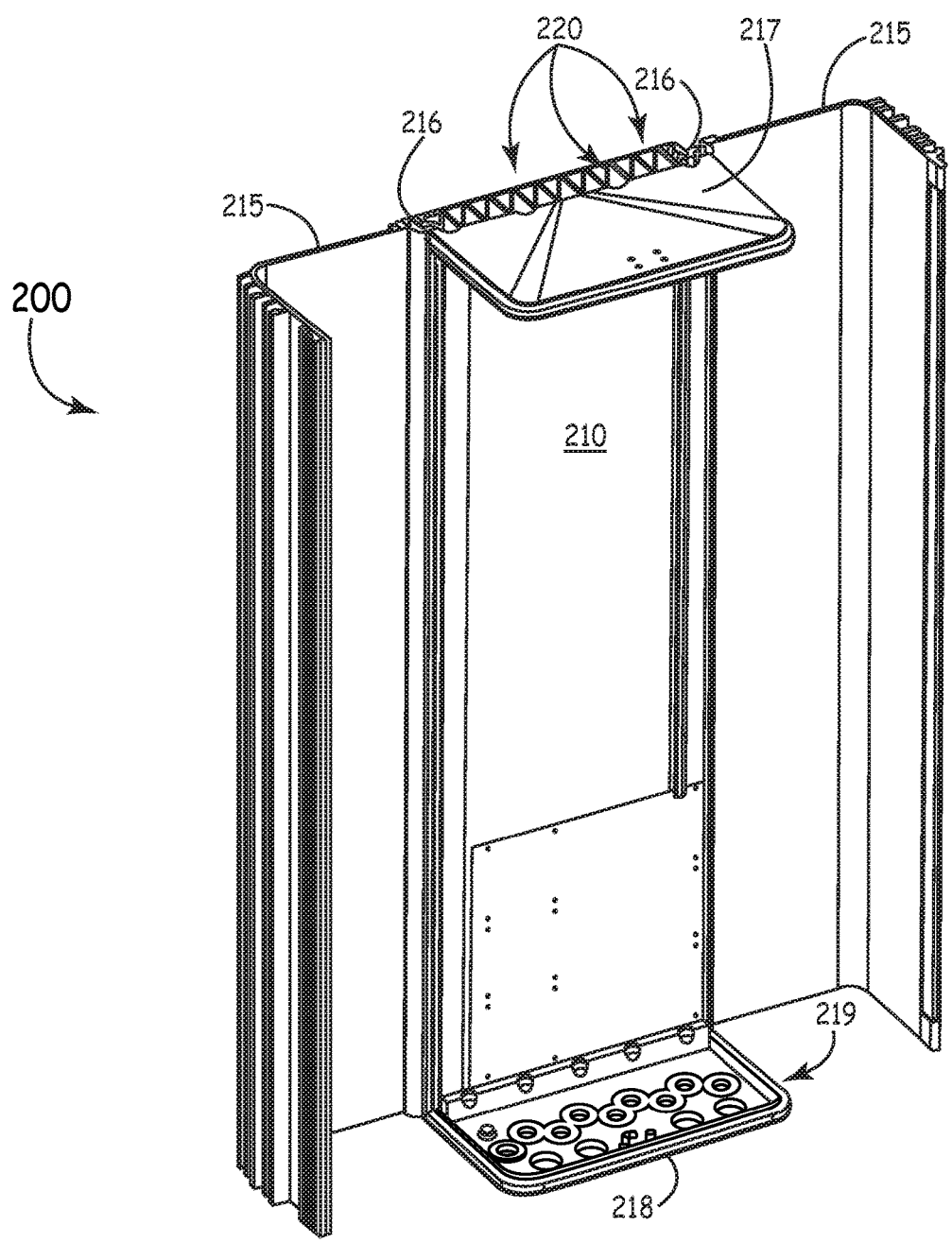
Figure 2B:
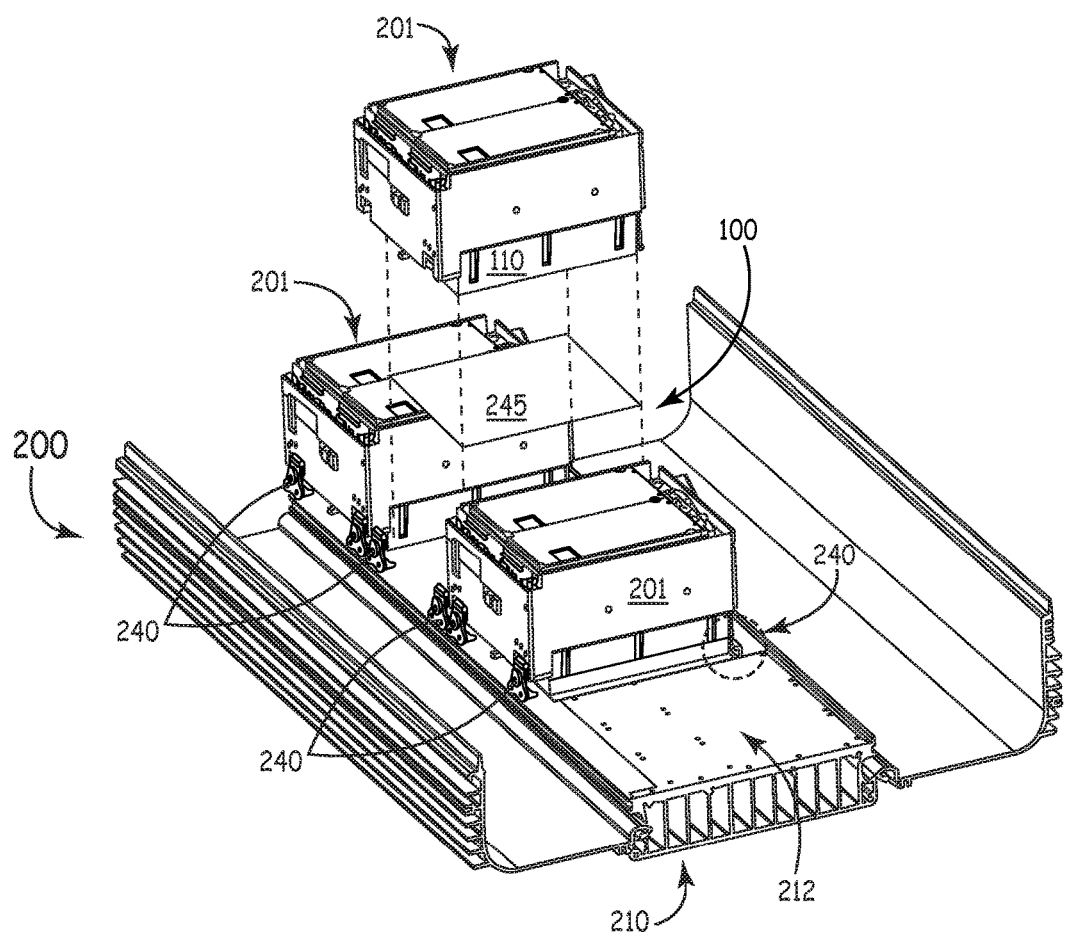
Figure 3:
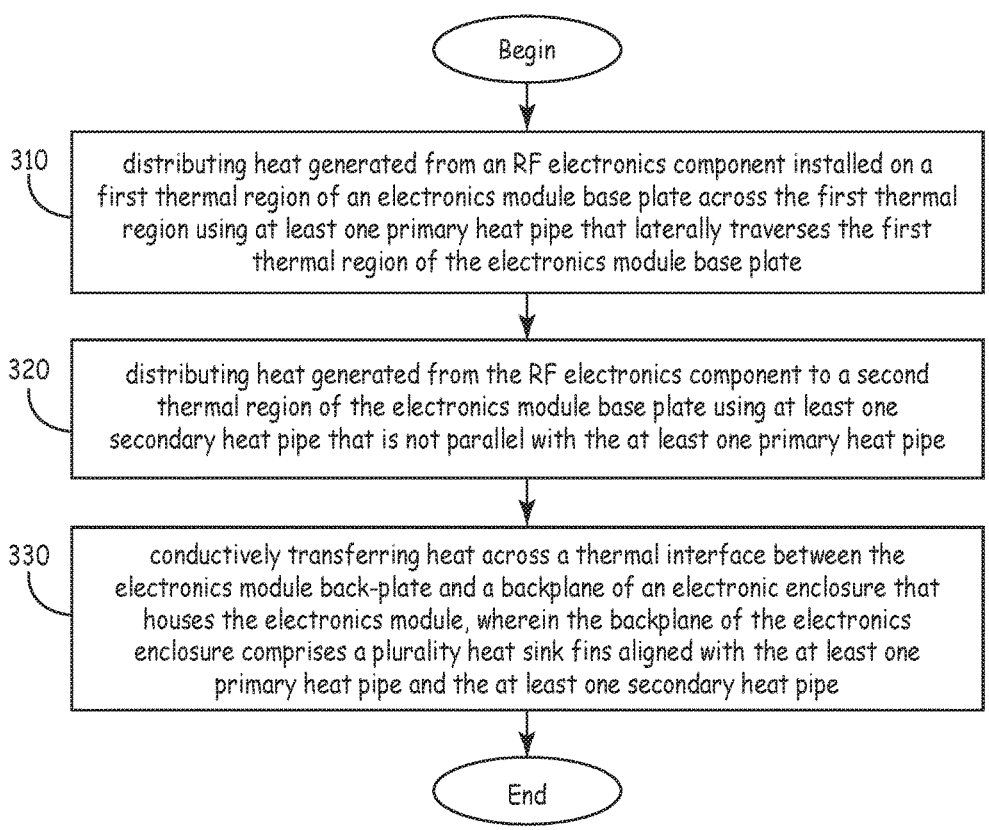

Embodiments of the present invention can be more easily understood and further advantages and uses thereof more readily apparent, when considered in view of the description of the preferred embodiments and the following figures in which:

FIG. 1 is a simplified block diagram illustrating a removable radio frequency (RF) electronics module of one embodiment of the present invention;

FIGS. 2A and 2B provide an isometric view of removable RF electronics modules in combination with an electronics enclosure, or one embodiment of the present invention; and FIG. 3 is a flow chart illustrating a method of one embodiment of the present invention.

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present invention provide for thermal management of telecommunications equipment enclosures through a strategic placement of heat pipes that transfers heat from high temperature point sources within removable RF electronics modules to non-heat saturated regions of the modules while at the same time orienting the heat pipes to spread heat to a plurality of fins of the enclosures heat sink.

FIG. 1 is a simplified block diagram illustrating a removable radio frequency (RF) electronics module 100 of one embodiment of the present invention. RF electronics module 100 comprises a base plate 110 having a first thermal region 112 and a second thermal region 114. When installed inside an enclosure, the removable RF electronics module 100 as shown is oriented vertically such that the first thermal region 112 is positioned above second thermal region 114 with respect to the Earth. As illustrated in FIG. 1, RF electronic components 120 are mounted to the first region 112. In the second region 114, thermally sensitive digital components 122 are mounted. RF electronic components 120 include components such as RF power amplifiers. In one embodiment, RF electronic components 120 are laterally centered within first region 112. Digital components 122 include components such as, but are not limited to, microprocessor, digital signal processors, integrated circuits, data storage buffers and or memories, and the like.

Within the first region 112, a plurality of linear heat pipes (shown at 130) are positioned approximately parallel to each other and embedded within base plate 110. Further, heat pipes 130 are oriented laterally across base plate 110 such that they traverse through an interfacing area (shown at 116) of base plate 110 to which RF electronic components 120 are mounted and conductively transfer heat to base plate 110.

In operation, heat pipes 130 conductively absorb heat from interfacing area 116 and move that heat laterally outwards from interfacing area 116 towards the edge regions 118 of base plate 110 within the first region 112. In other words, heat pipes 130 function to draw at least some heat away from interfacing area 116 without drawing that heat towards the temperature sensitive digital components 122 in the second region 114.

As would be appreciated by one of ordinary skill in the art upon reading this specification, heat pipes do not themselves dissipate heat but instead move heat from one location to another. Therefore, when too much heat is moved from interfacing area 116 to edge regions 118, those edge regions 118 will become heat saturated and unable to sink any more heat.

For this reason, at least one additional secondary heat pipe 132 is provided within base plate 110 that is centered within interfacing area 116 but curves down so that heat from components 120 is moved into the second region 114. In this case, secondary heat pipe 133 functions to draw heat away from interfacing area 116 toward regions 119, which are not saturated with heat.

Heat pipe operation is based on gravity and capillary action. They work most efficiently when the heat source is located at the lower end of the heat pipe and the heat sink region above. In that case, gravity forces the working fluid of the pipe down towards the heat source where it vaporizes and rises up towards the heat sink to cool. With the secondary heat pipe 132 however, the heat source is located at interfacing area 116, which is above the desired heat sink regions 119. Accordingly, the secondary heat pipe 132 relies entirely on pumping provided by capillary action to bring the cooled working fluid back to interfacing area 116. This design therefore restricts the efficiency of secondary heat pipe 132 so that some heat transfer from interfacing area 116 is provided, but without causing enough heat to accumulate in second region 114 to interfere with the operation of digital components 122.

FIGS. 2A and 2B provides a more detailed isometric view of an electronics enclosure 200 and removable RF electronics module 100 installed onto a backplane 210 of the electronics enclosure 200.

As shown in FIG. 2A, in one embodiment, electronics enclosure 200 comprises a top panel 217 and bottom panel 218 attached to a backplane 210 and a pair of doors 215 each attached via respective hinges 216 to backplane 210. When closed, doors 215, top panel 217, bottom panel 218 and backplane 210 define a weather resistant environment for housing one or more RF electronics modules (shown generally at 201) such as RF electronics module 100. In the particular embodiment illustrated by FIGS. 2A and 2B, enclosure 200 is dimensioned to house up to four RF electronics modules.

In one embodiment, either one or both of the panels 217, 218 include cable penetrations (shown generally at 219) to connect RF electronics modules 201 with external telecommunications equipment, networks, and/or power sources. In operation, electronics enclosure 200 is approximately installed such that top panel 217 is oriented in an upward direction (that is, oriented away from the Earth) relative to bottom panel 218. Such an orientation of enclosure 200 is referred to herein as a "vertical" orientation.

Backplane 210 further functions as the primary heat sink for electronics enclosure 200 and comprises a plurality of heat sink fins 220 (together with those air spaces between the heat sink fins 220) that function to convectively transfer heat generated within enclosure 200 to the external environment. Each of the RF electronics modules 201 includes one or more fastening systems 240 that secure RF electronics modules 201 to backplane 210 such that a surface each module's base plate 110 interfaces with an internal surface 212 of backplane 210. In one embodiment, each module's base plate 110 thermally interfaces with the internal surface 212 of backplane 210 via a thermally conducing pad (shown at 245) or similar material placed between the interfacing surfaces of the RF electronics modules 201 and backplane 210. Each of the RF electronics modules 201 are secured within enclosure 200 such that their respective first thermal regions 112 are oriented towards top panel 217 and their respective second thermal regions 114 are oriented towards bottom panel 218. In one embodiment, as a results of RF electronics module 100 installed as such, heat pipes 130 for each of the RF electronics modules are oriented to run substantially perpendicular to the heat sink fins 220 while secondary heat pipe 132 is oriented to cross over at least a plurality of the heat sink fins 220. Heat pipes 130 and 132 will thus function to not only draw heat away from RF electronic components 120 in a manner that avoids overheating of digital components 122, but also distribute that heat across backplane 210 for removal into the environment external to enclosure 200.

FIG. 3 is a flow chart illustrating a method for thermal management for modular RF electronics within a telecommunications electronics enclosure. The method begins at 310 with distributing heat generated from an RF electronics component installed on a first thermal region of an electronics module base plate across the first thermal region using at least one primary heat pipe that laterally traverses the first thermal region of the electronics module base plate. The method proceeds to 320 with distributing heat generated from the RF electronics component to a second thermal region of the electronics module base plate using at least one secondary heat pipe that is not parallel with the at least one primary heat pipe. In one embodiment, one or more digital components are mounted to the base plate within the second thermal region, below the RF electronics components.

The method proceeds to 330 with conductively transferring heat across a thermal interface between the electronics module back-plate and a backplane of an electronics enclosure that houses the electronics module, wherein the backplane of the electronics enclosure comprises a plurality heat sink fins aligned with the at least one primary heat pipe and the at least one secondary heat pipe. In one embodiment, the electronics module base plate is secured to the backplane of the electronics enclosure with one or more fasteners that orient the electronics module base plate such that the first thermal region is positioned vertically above the second thermal region. In one embodiment, heat is conductively transferring heat across the thermal interface via a thermally conducing pad, a thermally conducting paste, or similar material placed between the interfacing surfaces of the electronics module back-plate the backplane of the electronics enclosure.

In one embodiment, as a result of the electronics module base plate installed as such, the primary heat pipes for each of the electronics modules installed within the enclosure are oriented to run substantially perpendicular to the heat sink fins while the secondary heat pipe is oriented to cross over at least a plurality of the heat sink fins. The primary and secondary heat pipes will thus function to not only draw heat away from the RF electronic components in a manner that avoids overheating of any digital components within the module, but also distribute that heat across the backplane of the enclosure for removal into the external environment.

For the embodiments described above, the modular nature of having removable RF electronics modules that include the heat pipes (rather than, or in addition to including heat pipes with backplane, for example) provides for flexibility in configuring combinations of different RF electronics modules within the enclosures. That is, the particular position, orientation and number of heat pipes used for a particular RF electronics module would be based on the particular design considerations for that module. However, each module would thermally interface with the enclosure in the same manner. Thus, with embodiments of the present invention, a module having a first heat pipe configuration could easily be replaced within the enclosure by a module having a different heat pipe configuration, without any need to structurally alter the enclosure itself. Where an enclosure includes a plurality of RF electronics modules, the heat pipe configurations within the base plate of each of those RF electronics modules need not be the same.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A system comprising:
a power amplifier module including:
a power amplifier circuit;
a base plate, wherein the power amplifier circuit is mounted to the base plate; and
a plurality of heat pipes embedded within the base plate; and
a heat sink having a plurality of fins, wherein the power amplifier module is removably attached to the heat sink with one or more fastening systems, wherein a surface of the base plate interfaces with the heat sink, wherein the plurality of heat pipes are oriented to extend across the plurality of fins of the heat sink, wherein the plurality of heat pipes are oriented to run substantially perpendicular to the plurality of fins of the heat sink, wherein the plurality of heat pipes are approximately parallel to each other.

2. The system of claim 1, further comprising at least one heat pipe that is not parallel with the plurality of heat pipes.

3. The system of claim 1, wherein at least one thermally sensitive component is mounted to the base plate.

4. The system of claim 3, wherein the at least one thermally sensitive component comprises a microprocessor, a digital signals processor, integrated circuits, a data storage buffer, or a memory.

5. An electronics module comprising:
a base plate having a first thermal region;
a plurality of heat pipes embedded within the base plate; and
at least one electronic component mounted to the base plate;
wherein the plurality of heat pipes are configured to conductively transfer heat from the first thermal region to at least one edge of the base plate;
wherein the base plate is removably attached to a heat sink having a plurality of fins with one or more fastening systems, wherein a surface of the base plate interfaces with the heat sink, wherein the plurality of heat pipes are oriented to extend across the plurality of fins of the heat sink, wherein the plurality of heat pipes are oriented to run substantially perpendicular to the plurality of fins of the heat sink, wherein the plurality of heat pipes are approximately parallel to each other.

6. The electronics module of claim 5, further comprising at least one heat pipe that is not parallel with another heat pipe of plurality of heat pipes.

7. The electronics module of claim 5, wherein the at least one electronic component includes at least one high heat generating component, wherein the at least one high heat generating component is mounted to the first thermal region.

8. The electronics module of claim 7, wherein the at least one high heat generating component is a power amplifier circuit.

9. The electronics module of claim 7, wherein the at least one electronic component includes at least one thermally sensitive component communicatively coupled to the at least one high heat generating component, wherein the at least one thermally sensitive component is mounted to a second thermal region of the base plate.

10. The electronics module of claim 9, further comprising a first heat pipe that curves away from the plurality of heat pipes, wherein the first heat pipe is configured to spread heat to the second thermal region and away from the plurality of heat pipes and the high heat generating component.

11. The electronics module of claim 5, wherein the base plate is thermally coupled to the heat sink via a thermally conducting pad or a thermally conducting material.

12. An electronics module comprising:
a power amplifier circuit;
a base plate having a first surface interfacing with the power amplifier circuit;
at least one heat sinking element having a plurality of fins, wherein the at least one heat sinking element is configured to transfer heat to ambient air in which the power amplifier module is located; and
a plurality of heat pipes embedded within the base plate and configured to conductively transfer heat conductively received from the power amplifier circuit in a first thermal region of the base plate laterally through the base plate to the at least one heat sinking element, wherein the plurality of heat pipes are configured to extend across the plurality of fins of the at least one heat sinking element, wherein the plurality of heat pipes art configured to run substantially perpendicular to the plurality of fins of the at least one heat sinking element, wherein the plurality of heat pipes are approximately parallel to each other.

13. The electronics module of claim 12, wherein the base plate is removably attached to the at least one heat sinking element with one or more fastening systems.

14. The electronics module of claim 13, wherein a second surface of the base plate physically interfaces with at least a portion of the at least one heat sinking element.

* * * * *